US012003176B2

(12) United States Patent
Tanaka et al.

(10) Patent No.: US 12,003,176 B2
(45) Date of Patent: Jun. 4, 2024

(54) IN-VEHICLE POWER SUPPLY SYSTEM TO DETECT FAILURE FOR A BI-DIRECTIONAL DC-DC CONVERTER'S CONVERSION CIRCUIT

(71) Applicant: Panasonic Intellectual Property Management Co., Ltd., Osaka (JP)

(72) Inventors: Hideki Tanaka, Osaka (JP); Takeshi Nakayashiki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 280 days.

(21) Appl. No.: 17/607,024

(22) PCT Filed: Jun. 1, 2020

(86) PCT No.: PCT/JP2020/021550
§ 371 (c)(1),
(2) Date: Oct. 27, 2021

(87) PCT Pub. No.: WO2020/246415
PCT Pub. Date: Dec. 10, 2020

(65) Prior Publication Data
US 2022/0216791 A1   Jul. 7, 2022

(30) Foreign Application Priority Data

Jun. 7, 2019  (JP) ................. 2019-106606

(51) Int. Cl.
*H02M 3/158* (2006.01)
*B60L 1/00* (2006.01)
*G01R 31/40* (2020.01)

(52) U.S. Cl.
CPC .............. *H02M 3/158* (2013.01); *B60L 1/00* (2013.01); *G01R 31/40* (2013.01)

(58) Field of Classification Search
CPC .......... H02M 3/07; H02M 3/073; H02M 7/10; H02M 7/103; H02M 7/106; H02M 1/088;
(Continued)

(56) References Cited

U.S. PATENT DOCUMENTS 9,364,512 B1 *  6/2016  Drummond, III ... A61K 31/385
10,574,138 B2 *  2/2020  Yang .................. H02M 3/158
(Continued)

FOREIGN PATENT DOCUMENTS

JP      2007-202290      8/2007

OTHER PUBLICATIONS

International Search Report of PCT application No. PCT/JP2020/021550 dated Jul. 14, 2020.

*Primary Examiner* — Thienvu V Tran
*Assistant Examiner* — Nusrat Quddus
(74) *Attorney, Agent, or Firm* — WHDA, LLP (57) ABSTRACT

An in-vehicle power supply system includes a high-voltage direct-current (DC) power supply, a low-voltage storage battery, a DC-DC converter, and a controller. The DC-DC converter includes a conversion circuit including a high-voltage terminal and a low-voltage terminal, an input switch connected between the high-voltage DC power supply and the high-voltage terminal, and an output switch connected between the low-voltage terminal and the low-voltage storage battery. The controller is configured to, after detecting that a current flowing through the conversion circuit exceeds a predetermined current threshold or that a charge voltage of the low-voltage storage battery exceeds a predetermined voltage threshold, execute a failure determination of the DC-DC converter after instructing the conversion circuit to stop a voltage conversion operation, causing the input switch to switch to the disconnected state, and instructing the output switch to switch to the disconnected state. The (Continued)

controller is configured to, in the failure determination execute a first determination operation including an output short-circuit failure determination, an output open-circuit failure determination, and an input short-circuit failure determination. If determining, in the first determination operation, that the output switch does not have failure, controller is configured to execute a second determination operation of determining whether or not the conversion circuit has failure. If determining, in the second determination operation, that the conversion circuit does not have failure, the controller is configured to execute a third determination operation of determining whether or not the input switch has failure. The in-vehicle power supply device determines the location of failure easily.

6 Claims, 3 Drawing Sheets

(58) Field of Classification Search
CPC ..... H02M 2003/071; H02M 2003/072; H02M 2003/075; H02M 2003/076; H02M 2003/077; H02M 2003/078; H02M 2001/007; H02M 2001/0048; H02M 3/1582; H02M 3/1584; H02M 3/285; H02M 3/33561; H02M 7/49; H02M 1/045; H02M 7/006; H02M 7/06; H02M 7/068; H02M 7/153; H02M 7/19; H02M 7/08; H02M 7/17; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 2003/1557; H02J 3/46; H02J 3/38; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H05B 39/048; B23K 11/24; H04B 2215/069
See application file for complete search history.

(56) References Cited

U.S. PATENT DOCUMENTS

| | | | |
|---|---|---|---|
| 10,778,099 B1* | 9/2020 | Womac | H02M 1/32 |
| 2008/0238527 A1* | 10/2008 | Bolz | H02J 7/0014 |
| | | | 307/10.6 |
| 2010/0067152 A1* | 3/2010 | Nakahashi | H02M 1/32 |
| | | | 361/18 |
| 2014/0097814 A1* | 4/2014 | Brewster | H02M 3/156 |
| | | | 323/282 |
| 2014/0203763 A1* | 7/2014 | Zhao | H02J 7/00711 |
| | | | 320/162 |
| 2016/0352222 A1* | 12/2016 | Tagliavia | H02M 3/155 |
| 2016/0359320 A1* | 12/2016 | Bisogno | H02H 9/02 |
| 2018/0351396 A1* | 12/2018 | Chen | H02J 7/00711 |
| 2019/0103809 A1* | 4/2019 | Yang | H02M 3/158 |
| 2019/0180741 A1* | 6/2019 | Park | G10L 15/10 |
| 2022/0180867 A1* | 6/2022 | Bobbili | G10L 15/22 |
| 2022/0190734 A1* | 6/2022 | Kim | H02M 1/32 |

* cited by examiner

IN-VEHICLE POWER SUPPLY SYSTEM TO DETECT FAILURE FOR A BI-DIRECTIONAL DC-DC CONVERTER'S CONVERSION CIRCUIT

TECHNICAL FIELD

The present invention relates to an in-vehicle power supply system for use in various types of vehicles.

BACKGROUND ART

Figure 3:
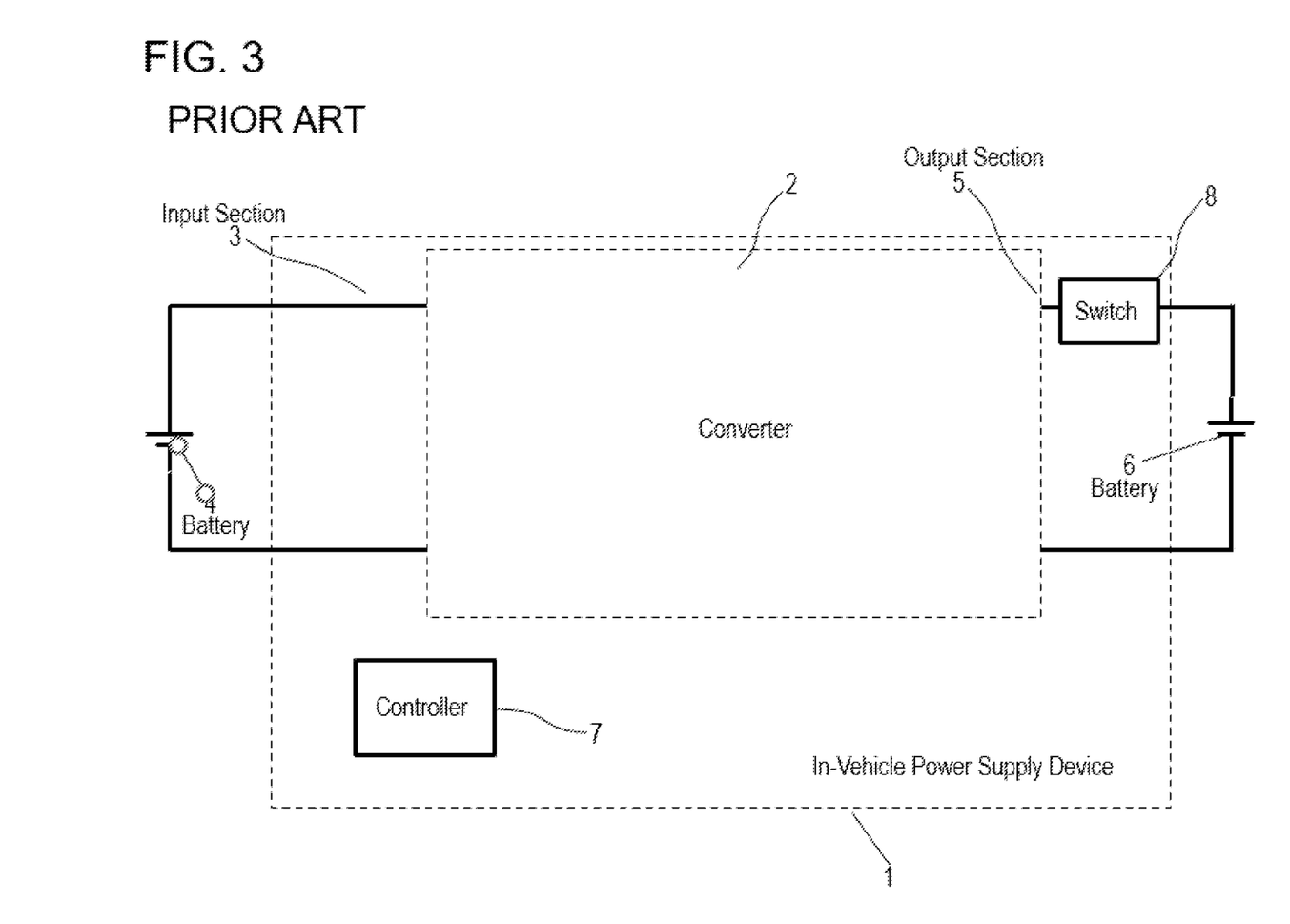
FIG. 3 is a circuit block diagram of a conventional in-vehicle power supply system.

FIG. 3 is a circuit block diagram of conventional in-vehicle power supply device 1. In-vehicle power supply device 1 includes converter 2. Input section 3 of in-vehicle power supply device 1 is connected to battery 4 while output section 5 is connected to battery 6. In-vehicle power supply device 1 includes controller 7. Controller 7 detects currents and voltages of input section 3 and output section 5 and controls an operation of converter 2 in response to the detected values.

When detecting an abnormal value of the current or the voltage at input section 3 or output section 5, controller 7 determines that in-vehicle power supply device 1 has failure, turns off switch 8 between output section 5 and battery 6, and outputs a warning signal to the outside of in-vehicle power supply device 1.

A conventional in-vehicle power supply device similar to in-vehicle power supply device 1 is disclosed in, for example, PTL 1.

CITATION LIST

Patent Literature

PTL 1: Japanese Patent Laid-Open Publication No. 2007-202290

SUMMARY

An in-vehicle power supply system includes a high-voltage direct-current (DC) power supply, a low-voltage storage battery, a DC-DC converter, and a controller. The DC-DC converter includes a conversion circuit including a high-voltage terminal and a low-voltage terminal, an input switch connected between the high-voltage DC power supply and the high-voltage terminal, and an output switch connected between the low-voltage terminal and the low-voltage storage battery. The controller is configured to, after detecting that a current flowing through the conversion circuit exceeds a predetermined current threshold or that a charge voltage of the low-voltage storage battery exceeds a predetermined voltage threshold, execute a failure determination of the DC-DC converter after instructing the conversion circuit to stop a voltage conversion operation, causing the input switch to switch to the disconnected state, and instructing the output switch to switch to the disconnected state. The controller is configured to, in the failure determination execute a first determination operation including an output short-circuit failure determination, an output open-circuit failure determination, and an input short-circuit failure determination. If determining, in the first determination operation, that the output switch does not have failure, controller is configured to execute a second determination operation of determining whether or not the conversion circuit has failure. If determining, in the second determination operation, that the conversion circuit does not have failure, the controller is configured to execute a third determination operation of determining whether or not the input switch has failure.

The in-vehicle power supply device determines the location of failure easily.

DESCRIPTION OF EMBODIMENTS

Figure 1:
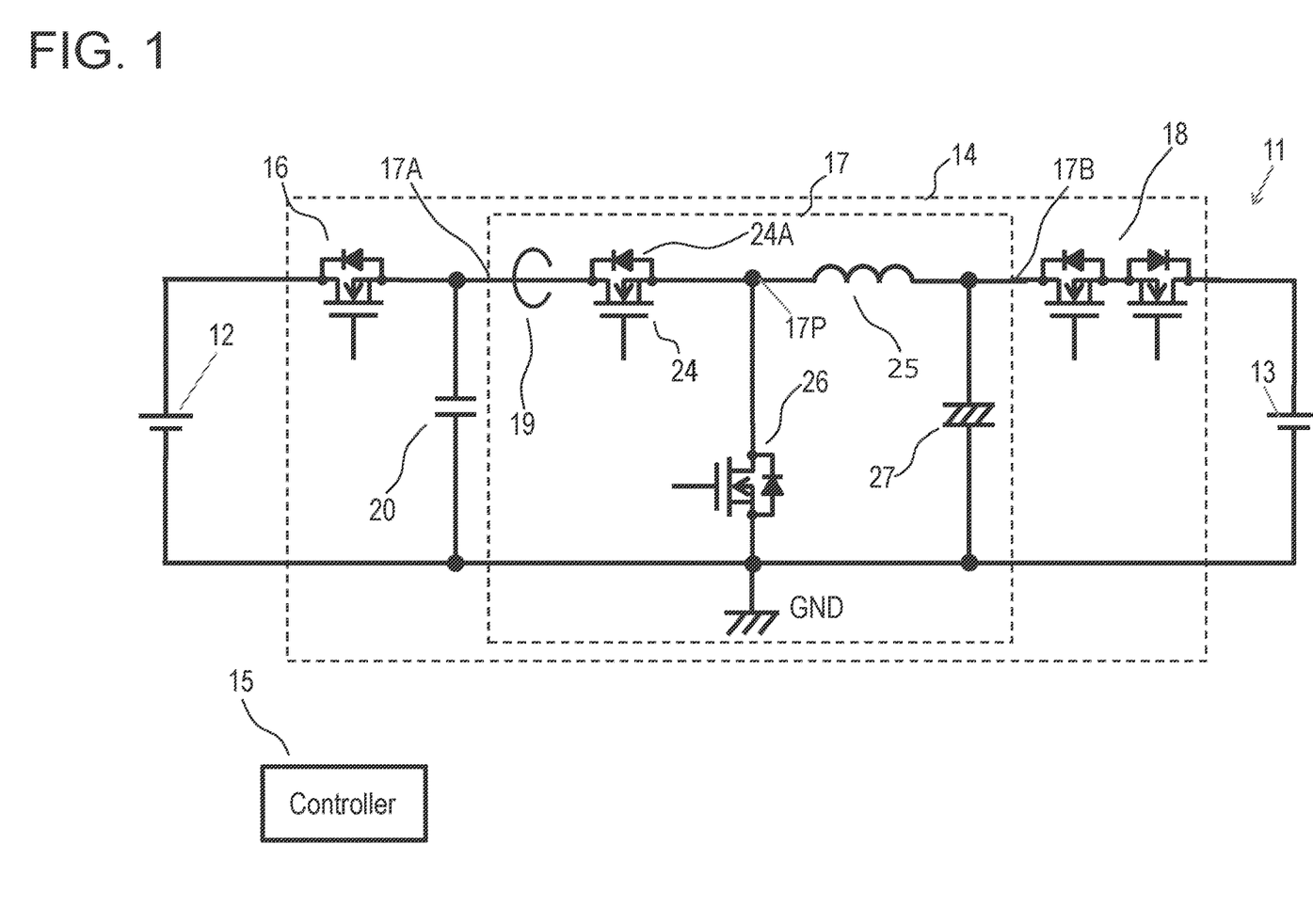
FIG. 1 is a circuit block diagram of an in-vehicle power supply system in accordance with an exemplary embodiment.

FIG. 1 is a circuit block diagram of in-vehicle power supply system 11 in accordance with an exemplary embodiment. In-vehicle power supply system 11 includes high-voltage DC power supply 12, low-voltage storage battery 13, DC-DC converter 14, and controller 15.

DC-DC converter 14 is connected to high-voltage DC power supply 12 and low-voltage storage battery 13 between high-voltage DC power supply 12 and low-voltage storage battery 13. DC-DC converter 14 includes input switch 16, conversion circuit 17 configured to perform a bidirectional operation, and output switch 18 which are connected in series from high-voltage DC power supply 12 to low-voltage storage battery 13 in this order. DC-DC converter 14 further includes current detector 19. High-voltage terminal 17A of conversion circuit 17 is connected to input switch 16. Low-voltage terminal 17B of conversion circuit 17 is connected to output switch 18.

Input switch 16 includes one terminal connected to high-voltage DC power supply 12 and another terminal. Input switch 16 is configured to selectively switch to a connected state of connecting the one terminal thereof to another terminal thereof and to a disconnected state of disconnecting the one terminal thereof from another terminal thereof. Converter circuit 17 includes high-voltage terminal 17A and low-voltage terminal 17B. High-voltage terminal 17A is connected to another terminal of input switch 16. Converter circuit 17 is configured to perform a bidirectional operation of performing a boosting-up operation of boosting up a voltage of low-voltage terminal 17B to obtain a voltage of high-voltage terminal 17A, and a stepping-down operation of stepping down the voltage of high-voltage terminal 17A to obtain the voltage of the low-voltage terminal 17B. Output switch 18 includes one terminal connected to low-voltage terminal 17B of conversion circuit 17 and another terminal connected to low-voltage storage battery 13. Output switch 18 is configured to selectively switch to a connected state of connecting the one terminal thereof and to another terminal thereof and to a disconnected state of disconnecting the one terminal thereof from another terminal thereof.

Controller 15 monitors a current flowing through conversion circuit 17 of DC-DC converter 14 and detected by current detector 19 and a he charge voltage of low-voltage storage battery 13. Controller 15 controls an operation of DC-DC converter 14 based on the values of the current flowing through conversion circuit 17 and the charge voltage of low-voltage storage battery 13.

If controller 15 detects that the current flowing through conversion circuit 17 exceeds a predetermined current threshold or that the charge voltage of low-voltage storage battery 13 exceeds a predetermined voltage threshold, controller 15 instructs conversion circuit 17 to stop a power conversion operation, and instructs input switch 16 and output switch 18 to be in the disconnected state. After that, controller 15 executes a failure determination of DC-DC converter 14.

The operations of the failure determination include a first determination operation, a second determination operation, and a third determination operation, which will be described below.

At first, the first determination operation is executed. In the first determination operation, while controller 15 instructs output switch 18 to be in the disconnected state, controller 15 detects low-voltage value VL1 of low-voltage terminal 17B of conversion circuit 17. Based on low voltage value VL1, controller 15 performs an output short-circuit failure determination of determining whether output switch 18 is continuously short-circuited thus having failure due to short-circuit thereof, or is in a normal state in which output switch 18 is disconnectable.

Further, controller 15 instructs output switch 18 to be in the connected state. After that, controller 15 detects low voltage value VL2 of low-voltage terminal 17B of conversion circuit 17. Based on low voltage value VL2, controller 15 performs an output open-circuit failure determination of determining whether output switch 18 is continuously in the disconnected state, i.e., continuously opens, thus having failure due to open-circuit, or output switch 18 is in a normal state in which output switch 18 is connectable.

Further, while controller 15 instructs input switch 16 to be in the disconnected state, controller 15 detects high voltage value VH1 of high-voltage terminal 17A of conversion circuit 17. High voltage value VH1 may be obtained by detecting the voltage of the high potential side of input capacitor 20. Based on high voltage value VH1, controller 15 performs a short-circuit failure determination of determining whether input switch 16 is continuously short-circuited, thus having failure due to short-circuit, or is in a normal state in which input switch is disconnectable.

At this moment, since conversion circuit 17 is stopped, electric power is not supplied from conversion circuit 17 to high-voltage terminal 17A of conversion circuit 17. If input switch 16 is properly disconnectable, the voltage from high-voltage DC power supply 12 through input switch 16 is not applied to high-voltage terminal 17A of conversion circuit 17 while input switch 16 is in the disconnected state. Therefore, when high voltage value VH1 at high-voltage terminal 17A of conversion circuit 17 is higher than high-voltage threshold VTH1, controller 15 determines that input switch 16 has failure due to short-circuit thereof. When high voltage value VH1 is lower than high-voltage threshold VTH1, controller 15 determines that input switch 16 does not have failure and is normal. For example, high-voltage threshold VTH1 is set to be a value approximately within a range of one-tenth to one-half of a reference voltage value of high-voltage DC power supply 12 such that, when input switch 16 has failure due to short-circuit, the failure is detected properly even if a voltage drop occurs due to a contact resistance of input switch 16. As described above, controller 15 obtains the voltage of high-voltage terminal 17A by detecting the voltage of input capacitor 20, which is connected to ground GND and a node at which conversion circuit 17 is connected to input switch 16.

In the first determination operation, the controller 15 preferably may initially execute the input short-circuit failure determination of determining a short-circuit failure of input switch 16, after that, execute the output short-circuit failure determination for determining a short-circuit failure of output switch 18, and, after that, execute the output open-circuit failure determination of determining an open-circuit failure of output switch 18. Alternatively, the controller 15 may initially execute the determination of a short-circuit failure of output switch 18, after that, execute the determination of a short-circuit failure of input switch 16, and, after that, execute the determination of an open-circuit failure of output switch 18.

When executing the determination for short-circuit failure before the determination for the open-circuit failure, the controller may prevent an overcurrent from flowing into a switch for which a failure is to be detected, which is caused by controller 15 instructing the switch to enable connection in a later failure determination operation. This prevents the occurrence of a secondary failure associated with the failure determination.

Next, a second determination operation is performed. The second determination operation is performed subsequent to the first determination operation if controller 15 determines, in the first determination operation, that output switch 18 is neither in short-circuit failure nor in open-circuit failure and also input switch 16 is not in short-circuit failure so that output switch 18 is properly controllable by controller 15. In the second determination operation, first, controller 15 instructs output switch 18 to be in the connected state. Further, controller 15 controls conversion circuit 17 to boost up the voltage of low-voltage terminal 17B of conversion circuit 17. In that condition, controller 15 detects high voltage value VH2 of high-voltage terminal 17A of conversion circuit 17. Based on high voltage value VH2, controller 15 determines whether conversion circuit 17 is capable of properly performing a boosting-up operation, that is, whether or not conversion circuit 17 has failure.

Next, a third determination operation is performed. The third determination operation is performed subsequent to the second determination operation if controller 15 determines, in the previously-performed second determination operation, that conversion circuit 17 has no failure to perform the boosting-up operation. In the third determination operation, first, controller 15 controls conversion circuit 17 to cause conversion circuit 17 not to perform the boosting-up operation. In that condition, controller 15 instructs input switch 16 to be in the connected state. Further, controller 15 detects high voltage value VH3 of high-voltage terminal 17A of conversion circuit 17. Based on high voltage value VH3, controller 15 performs an input open-circuit failure determination of determining whether input switch 16 has failure due to open-circuit thereof, or input switch 16 is connectable in a normal state.

With the configuration and operation as described above, it is possible to easily and accurately identify a portion of DC-DC converter 14 causing the failure.

Conventional in-vehicle power supply device 1 shown in FIG. 3 is able to identify the occurrence of a failure in in-vehicle power supply device 1, but unable to identify the portion of converter 2 causing the failure.

In-vehicle power supply system 11 preferably initially perform the short-circuit failure determination, then perform a failure determination for input switch 16 which is on the high voltage side, and after that, perform a failure determination for the low voltage side successively. In other words, the second determination operation may be executed in the middle of the first determination operation. This means that, even when a short-circuit failure occurs in conversion circuit 17, no voltage is applied to conversion circuit 17 or output switch 18 during the failure determination that proceeds from the high voltage side to the low voltage side. In other words, when an open-circuit failure determination is performed at the low voltage side, it has already been determined that conversion circuit 17 is not in short-circuit failure and that input switch 16 is normal and not in failure. Thereby, it is possible that, especially when determining a failure of output switch 18, no electric power is supplied from conversion circuit 17 or input switch 16. As a result, it is possible to prevent a secondary failure from occurring. Therefore, it is unnecessary to increase the withstand voltage of output switch 18 in consideration of the failure determination.

Figure 2:
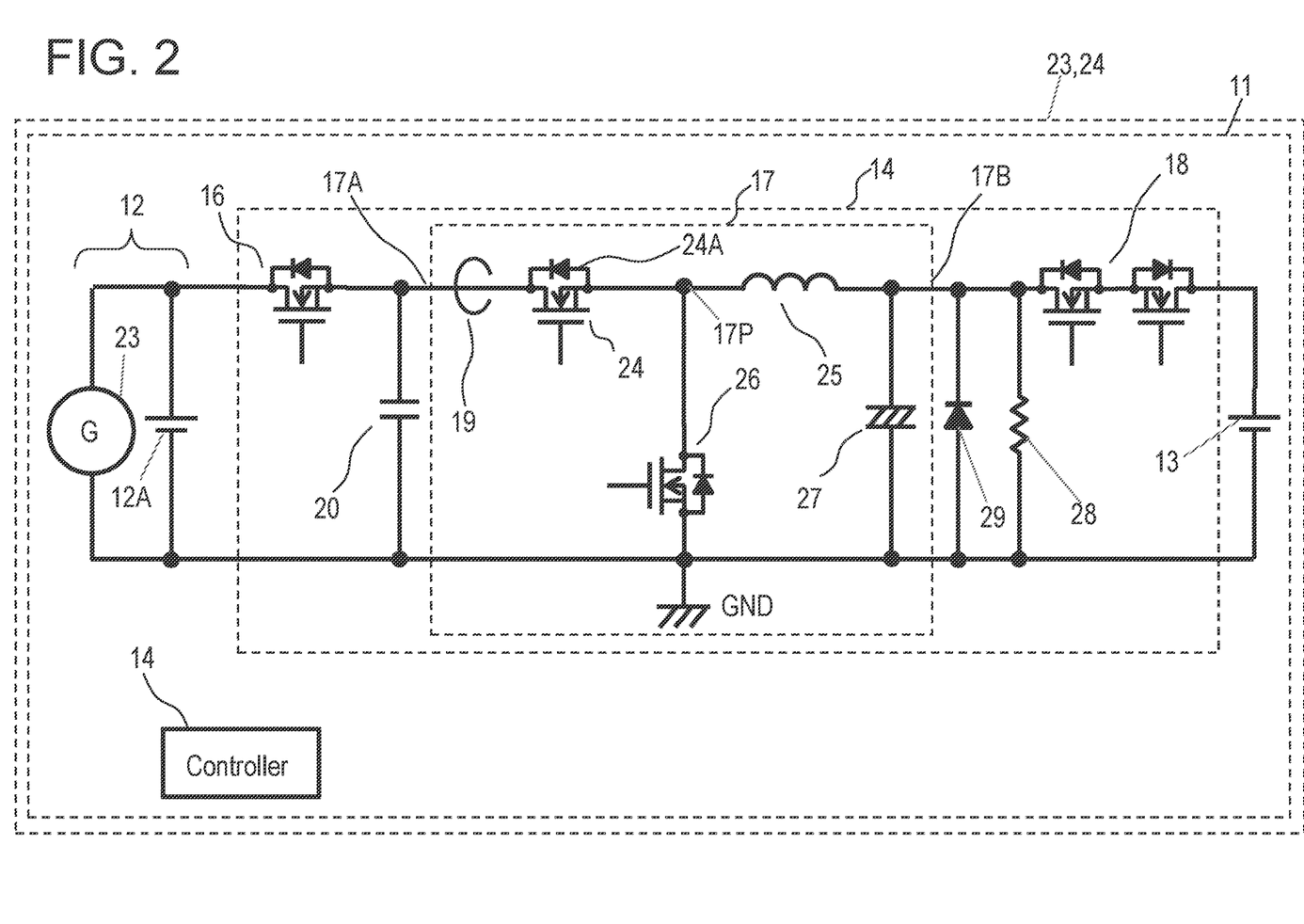
FIG. 2 is another circuit block diagram of the in-vehicle power supply system in accordance with the embodiment.

The configuration and operation of in-vehicle power supply system 11 will be detailed below. FIG. 2 is another circuit block diagram of in-vehicle power supply system 11 in accordance with the embodiment. In-vehicle power supply system 11 is mounted to vehicle body 22 of vehicle 21.

High-voltage DC power supply 12 may be implemented only by storage battery 12A, such as a lithium-ion battery with, e.g. a DC voltage of 48 V, or may include storage battery 12A and power generator 23 connected in parallel with storage battery 12A. Power generator 23 may include, for example, an alternator and a rectifier. Low voltage storage battery 13 is, for example, a lead-acid storage battery with a DC voltage of 12 V, which is lower than the voltage of high-voltage DC power supply 12. During driving, such as normal traveling of vehicle 21, low voltage storage battery 13 is charged by the electric power of high-voltage DC power supply 12.

As mentioned above, DC-DC converter 14 is connected between high-voltage DC power supply 12 and low voltage storage battery 13.

DC-DC converter 14 includes input switch 16, conversion circuit 17 capable of a bidirectional operation, output switch 18, and current detector 19 that are connected in series from high-voltage DC power supply 12 to low voltage storage battery 13 in this order.

Each of input switch 16 and output switch 18 may be implemented by a semiconductor switch, such as a field effect transistor (FET) or an insulated gate bipolar transistor (IGBT), or a relay switch having mechanical contacts. Converter circuit 17 is a bidirectional conversion circuit that is capable of both a stepping-down operation of stepping down a high voltage of high-voltage DC power supply 12 to a low voltage of low voltage storage battery 13 and a boosting-up operation of boosting up a low voltage of low voltage storage battery 13 to a high voltage of high-voltage DC power supply 12.

Converter circuit 17 includes high-side switch 24, choke coil 25, low-side switch 26, and smoothing capacitor 27. High-side switch 24 and choke coil 25 are connected in series in this order from high-voltage terminal 17A to low voltage terminal 17B of conversion circuit 17. Low-side switch 26 is connected to ground GND and node 17P at which high-side switch 24 is connected to choke coil 25. Smoothing capacitor 27 is connected to low voltage terminal 17B and ground GND.

High-side switch 24 thus includes one terminal and another terminal. One terminal of high-side switch 24 is connected to another terminal of input switch 16. Choke coil 25 has one terminal connected to another terminal of output switch 18, and another terminal connected to another terminal of high-side switch 24 at node 17P. Low-side switch 26 includes one terminal connected to node 17P and another terminal connected to ground GND.

High-side switch 24 and low-side switch 26 are controlled by controller 15 so as to perform a synchronously-rectifying operation so as to perform the boosting-up operation and the stepping-down operation.

Resistor 28 having a high resistance value is connected to low voltage terminal 17B of conversion circuit 17 and ground GND. In other words, resistor 28 has one terminal connected to low voltage terminal 17B of conversion circuit 17 and another terminal connected to ground GND. Resistor 28 is mainly used for detecting the voltage of low voltage terminal 17B.

Current detector 19 detects a he current flowing through conversion circuit 17. Controller 15 monitors the current detected by current detector 19 and the charge voltage for charging low voltage storage battery 13 which is the voltage across both ends of low voltage storage battery 13. Further, controller 15 controls DC-DC converter 14 based on the current flowing through conversion circuit 17 and the charge voltage of low voltage storage battery 13. This operation of controller 15 is an operation during driving, such as normally traveling of vehicle 21.

In FIG. 1, current detector 19 is provided between input switch 16 and high-side switch 24 to detect the current flowing through high-side switch 24. However, current detector 19 may be provided to detect a he current flowing through low-side switch 26. Alternatively, current detector 19 may be provided at the one terminal or another terminal of choke coil 25 to detect a he current flowing through choke coil 25. Further, current detector 19 may be provided at plural locations to detect currents flowing through plural components. Current detector 19 detects the current of DC-DC converter 14.

However, current detector 19 may detect the current flowing through low voltage storage battery 13.

When controller 15 detects that the current flowing through conversion circuit 17 or the charge voltage of low voltage storage battery 13 exceeds a predetermined threshold, controller 15 instructs input switch 16, output switch 18, high-side switch 24, and low-side switch 26 to be continuously in the disconnected state. This configuration ensures safety from abnormality due to short-circuit. After that, controller 15 executes a failure determination operation of determining a failure of DC-DC converter 14. The failure determination operation may be executed either during traveling of vehicle 21 or immediately after vehicle 21 has been started with a starter switch.

In the first determination operation performed initially in the failure determination, the controller executes the following three determinations: a short-circuit failure determination for output switch 18, an open-circuit failure determination for output switch 18, and a short-circuit failure determination for input switch 16. Controller 15 detects low voltage value VL1 of low voltage terminal 17B of conversion circuit 17. Based on low voltage value VL1, controller 15 performs an output short-circuit failure determination of determining whether output switch 18 has failure due to short-circuit thereof in which output switch 18 is continuously short-circuited, or output switch 18 is in an normal state, i.e., disconnectable.

At this moment, since high-side switch 24 and low-side switch 26 are continuously in the disconnected state and conversion circuit 17 is stopped, electric power is not supplied from conversion circuit 17 to output switch 18. Then, if output switch 18 is in the disconnected state properly in response to the instruction from controller 15, no voltage is applied to resistor 28 from low voltage storage battery 13 via output switch 18. Therefore, when low voltage value VL1 that occurs at the high potential side of resistor 28 or smoothing capacitor 27 is higher than low voltage threshold VTL1, controller 15 determines that output switch 18 has failure due to short-circuit in which output switch 18 is continuously short-circuited and thus has failure due to the short-circuit. If low voltage value VL1 is lower than low voltage threshold VTL1, controller 15 determines that output switch 18 is normal. For example, low voltage threshold VTL1 is set to be approximately within a range of one-tenth to one-half of the reference voltage value of low voltage storage battery 13 such that, at the time of a short-circuit failure of output switch 18, the failure can be detected properly even if a voltage drop occurs due to a contact resistance of output switch 18.

Alternatively, controller 15 may detect the voltage across both terminals of output switch 18. Controller 15 may determine that output switch 18 has failure due to short-circuit thereof if the voltage across both terminals of output switch 18 is less than a threshold. In this case, controller 15 determines that output switch 18 is normal and has no failure if the voltage is greater than the threshold. For example, when output switch 18 has failure due to short-circuit thereof, the resistance between both terminals of output switch 18 is almost zero, so that the voltage is approximately zero. If output switch 18 is in the disconnected state properly in response to the instruction from controller 15, a voltage appears across both terminals of output switch 18, i.e., between low voltage storage battery 13 and grounded resistor 28. Accordingly, it is possible that the threshold here may range from about 0.1 V to about 1.0 V.

In the first determination operation, controller 15 instructs output switch 18 to be in the connected state. In this condition, controller 15 detects low voltage value VL2 of low voltage terminal 17B of conversion circuit 17. Based on low voltage value VL2, controller 15 performs an output open-circuit failure determination of determining whether output switch 18 is continuously in the disconnected state, i.e., continuously opens to have failure due to open-circuit, or output switch 18 is properly connectable.

At this moment, since conversion circuit 17 is stopped, electric power is not supplied from conversion circuit 17 to output switch 18. If output switch 18 is properly connectable in response to the instruction from controller 15, output switch 18 is switched to the connected state so that a voltage is applied to resistor 28 from low voltage storage battery 13 via output switch 18. Therefore, if low voltage value VL2 at the high potential side of smoothing capacitor 27 is lower than low voltage threshold VTL2, controller 15 determines that output switch 18 has failure due to open-circuit thereof. If low voltage value VL2 is higher than low voltage threshold VTL2, controller 15 determines that output switch 18 is normal, having no failure. When output switch 18 is switched to the connected state properly, the voltage drop due to output switch 18 is a very small value. Therefore, the target of low voltage threshold VTL2 may be set to a lower limit value within a normal fluctuation range of low voltage storage battery 13, such as a value that is about 1 V lower than the reference value of low voltage storage battery 13 or a value that is about 10% lower than the reference value of low voltage storage battery 13.

Alternatively, if controller 15 detects the voltage across both terminals of output switch 18 and the voltage between across both terminals of output switch 18 is greater than a threshold, controller 15 may determine that output switch 18 has failure due to open-circuit thereof. If the voltage is less than the threshold, controller 15 may determine that output switch 18 is normal, having no failure. For example, if output switch 18 has failure due to open-circuit, a voltage appears across both terminals of output switch 18, between low voltage storage battery 13 and grounded resistor 28. On the other hand, if output switch 18 is in a normal, connectable state, the resistance between both terminals of output switch 18 is almost zero, almost no voltage appears the voltage is about zero. Accordingly, the threshold may be set within a range from about 0.5 V to about 1.0 V.

In the first determination operation, controller 15 further detects high voltage value VH1 of high-voltage terminal 17A of conversion circuit 17. Based on high voltage value VH1, controller 15 performs an input short-circuit failure determination of determining whether input switch 16 is continuously in the connected state, i.e., continuously short-circuited to have failure due to the short-circuit, or input switch 16 is in a normal state, disconnectable. At this moment, since conversion circuit 17 is stopped, electric power is not supplied from conversion circuit 17 to input switch 16. If input switch 16 is properly in the disconnected state in response to the instruction from controller 15, no voltage is applied to high-voltage terminal 17A from high-voltage DC power supply 12 via input switch 16.

In the first determination operation, the controller preferably executes the input short-circuit failure determination of input switch 16 first among the output short-circuit failure determination of output switch 18, the output open-circuit failure determination of output switch 18, and the input short-circuit failure determination of input switch 16, and then, executes the output short-circuit failure determination of output switch 18 subsequently. After that, the controller executes the output open-circuit failure determination of output switch 18. Alternatively, the controller may execute the output short-circuit failure determination of output switch 18 first, then, execute the input short-circuit failure determination of input switch 16, and after that, execute the output open-circuit failure determination of output switch 18.

The determination of short-circuit failure is executed before the determination of open-circuit failure. This configuration prevents an overcurrent from flowing into a switch for which a failure is to be detected when controller 15 instructs the switch to switch be in a connected state in subsequent failure determination operations. This operation prevents a secondary failure associated with the failure determination. The secondary failure is more effectively prevented especially when the input short-circuit failure determination of input switch 16 is initially executed before the output short-circuit failure determination of output switch 18.

In the first determination operation, controller 15 executes the input short-circuit failure determination, the output short-circuit failure determination, and the output open-circuit failure. If determining that both input switch 16 and output switch 18 are normal and do not have failure in the input short-circuit failure determination, the output short-circuit failure determination, and the output open-circuit failure determination, controller 15 executes the second determination operation described later. If determining that any of input switch 16 and output switch 18 is in failure in these determinations, it is determined that DC-DC converter 14 has failure, and a switch with failure is identified. Controller 15 continuously stops DC-DC converter 14. Further, controller 15 transmits a warning signal reporting the failure to a vehicle control unit mounted to vehicle body 22.

Furthermore, after determining that output switch 18 is able to properly switch to both the connected state and the disconnected state and has no failure in the first determination operation, the controller 15 may determine whether or not low-side switch 26 has failure, as a preliminary determination operation. Herein, first, controller 15 instructs low-side switch 26 to be in the disconnected state. Then, in a limited short length of period PT1, output switch 18 that has been determined to be normal in the first determination operation is switched to the connected state. Then, after period PT1 has elapsed, output switch 18 is switched to the disconnected state.

Here, if low-side switch 26 is properly in the disconnected state in response to an instruction from controller 15, the voltage charged in smoothing capacitor 27 during period PT1 is maintained after completion of period PT1 and even when period PT2 has elapsed after the disconnecting of output switch 18. On the other hand, when low-side switch 26 is unable to be in the disconnected state properly in response to the instruction from controller 15 and has failure due to short-circuit thereof, the voltage charged in smoothing capacitor 27 during period PT1 is discharged through the short-circuited low-side switch 26 to ground GND, so that the voltage becomes almost zero after period PT2 has elapsed from the time when low-side switch 26 is instructed to be in the disconnected state after completion of period PT1.

In other words, after charging smoothing capacitor 27 in period PT1 by connecting output switch 18, controller 15 causes output switch 18 to be in the disconnected state. Controller 15 detects, based on the voltage across both terminals of resistor 28, the state of charge of smoothing capacitor 27 after the lapse of period PT2 from the disconnecting of output switch 18. If this voltage is lower than a predetermined voltage, controller 15 determines that low-side switch 26 has failure due to short-circuit thereof. If this voltage is equal to or higher than the predetermined voltage, controller 15 determines that low-side switch 26 has no failure doe to short-circuit.

The second determination operation is performed subsequent to the first determination operation. If controller 15 determines that output switch 18 has neither failure due to short-circuit nor open-circuit so that controller 15 can control output switch 18 properly and determines that input switch 16 has no failure due to short-circuit, controller 15 executes the second determination operation subsequent to the first determination operation.

In the second determination operation, first, controller 15 instructs output switch 18 to be in the connected state. Further, controller 15 instructs conversion circuit 17 to perform the boosting-up operation of boosting up the voltage of low voltage terminal 17B of conversion circuit 17. Then, controller 15 detects high voltage value VH2 at high-voltage terminal 17A of conversion circuit 17, which is obtained by the boosting-up operation. High voltage value VH2 may be obtained by detecting the voltage of the high potential side of input capacitor 20. Based on high voltage value VH2, controller 15 determines whether conversion circuit 17 may properly perform the boosting-up operation and whether or not conversion circuit 17 has failure.

Accordingly, if conversion circuit 17 increases high voltage value VH2, which is obtained by detecting the voltage of the high potential side of input capacitor 20, to be higher than high-voltage threshold VTH2, the controller determines that conversion circuit 17 is able to perform the boosting-up operation properly and conversion circuit 17 has no failure. High-voltage threshold VTH2 may be set to a value that is about 1 V higher than the reference value of high-voltage DC power supply 12 or a value that is about 10% higher than the reference value of high-voltage DC power supply 12.

If controller 15 determines that conversion circuit 17 has no failure in the second determination operation, controller 15 executes the following determination operation. When a failure is determined in the second determination operation, controller 15 determines that conversion circuit 17 has failure and identifies that a portion with failure is conversion circuit 17. Furthermore, controller 15 transmits a warning signal indicating the failure to the vehicle control unit mounted to vehicle body 22.

At the beginning of the second determination operation, controller 15 causes output switch 18 to switch to the connected state. Here, in the case where high-side switch 24 of conversion circuit 17 is implemented by a MOSFET having a parasitic diode that allows current to constantly flow in a direction from output switch 18 toward input switch 16, or in the case where high-side diode 24A that allows a current to constantly flow in the direction from output switch 18 toward input switch 16 is provided in parallel with high-side switch 24, a large current flows within a short time from low voltage storage battery 13 to input capacitor 20 when output switch 18 is switched to the connected state. Therefore, before controller 15 causes output switch 18 to continuously be in the connected state in the second determination operation, controller 15 may cause output switch 18 to operate as a switching element of a stepping-down converter so as to charge input capacitor 20 to a predetermined voltage.

The operation for charging input capacitor 20 will be detailed below. In conversion circuit 17, high-side switch 24 connected to input switch 16 is connected in series to choke coil 25 connected to output switch 18. Low-side switch 26 is connected to the ground and to node 17P at which high-side switch 24 is connected to choke coil 25. High-side diode 24A having a cathode connected to input switch 16 is connected in parallel to high-side switch 24. The cathode of converter diode 29 is connected low voltage terminal 17B of conversion circuit 17. The anode of the diode is connected to ground GND. Input capacitor 20 is connected to ground GND and high-voltage terminal 17A of conversion circuit 17.

If controller 15 determines that conversion circuit 17 has no failure in the first determination operation, controller 15 executes the second determination operation. In the second determination operation, controller 15 periodically turns on and off output switch 18 by driving output switch 18 with, e.g. a PWM signal to control switching of output switch 18, thereby operating choke coil 25, converter diode 29, and output switch 18 as a step-down converter. This converter operation produces a voltage lower than the voltage of low voltage terminal 17B at node 17P, and controller 15 charges input capacitor 20 through high-side diode 24A until both terminals of input capacitor 20 reaches a predetermined value. After that, controller 15 quits this converter operation, to complete charging of input capacitor 20.

After that, controller 15 instructs output switch 18 to continuously be in the connected state, and further, instructs conversion circuit 17 to perform the boosting-up operation of boosting up the voltage of low voltage terminal 17B of conversion circuit 17. After that, controller 15 detects high voltage value VH2 of high-voltage terminal 17A of conversion circuit 17, and determines, based on high voltage value VH2, whether or not conversion circuit 17 has failure.

The failure determination of conversion circuit 17 based on high voltage value VH2 is similar to the second determination operation, and will not be described further. In the case that output switch 18 is implemented by a semiconductor switch, such as a field effect transistor (FET) or an insulated gate bipolar transistor (IGBT), controller 15 can perform control on the switching operations.

Controller 15 performs the third determination operation after the second determination operation. If controller 15 determines that conversion circuit 17 is normal and conversion circuit 17 is able to perform the boosting-up operation and has no failure in the second determination operation, controller 15 executes the third determination operation subsequent to the second determination operation.

In the third determination operation, first, controller 15 instructs conversion circuit 17 not to perform the boosting-up operation.

Output switch 16 has been instructed to be in the disconnected state until then Controller 15 instructs output switch 16 to be in the connected state. After that, controller 15 detects high voltage value VH3 of high-voltage terminal 17A of conversion circuit 17. High voltage value VH3 may be obtained by detecting the voltage of the high potential side of input capacitor 20. Based on high voltage value VH3, controller 15 performs an input open-circuit failure determination of determining whether input switch 16 continuously opens and has failure due to open-circuit thereof or input switch 16 is properly connectable.

At this moment, conversion circuit 17 is stopped, so that electric power is not supplied from conversion circuit 17 to input switch 16. Then, if output input switch 16 is properly connectable in response to an instruction from controller 15, a voltage is applied to high-voltage terminal 17A from high-voltage DC power supply 12 via input switch 16 in the connected state. Therefore, if high voltage value VH3 of high-voltage terminal 17A of conversion circuit 17 is lower than high-voltage threshold VTH3, controller 15 determines that output switch 18 has failure due to open-circuit. If high voltage value VH3 is higher than high-voltage threshold VTH3, controller 15 determines that output switch 18 has no failure and is normal. For example, the target of high-voltage threshold VTH3 is set to a lower limit value within the normal fluctuation range of high-voltage DC power supply 12, such as a value that is about 10% lower than the reference value of high-voltage threshold VTH3. Similarly to the short-circuit failure determination, the controller 15 may obtain the voltage of high-voltage terminal 17A of conversion circuit 17 by detecting the voltage of input capacitor 20 connected to the high-voltage terminal 17A of conversion circuit 17 and to ground GND.

In the third determination operation, controller 15 determines whether or not input switch 16 has failure due to open-circuit thereof. If determining that input switch 16 has no failure and is normal, all the determinations are ended. On the other hand, if is determining that input switch 16 has failure due to open-circuit, controller 15 determines that DC-DC converter 14 has failure. Controller 15 continuously stops DC-DC converter 14 and identifies a portion with failure as input switch 16. Further, controller 15 transmits a warning signal indicating the failure to the vehicle control unit mounted to vehicle body 22.

The configuration and operation as described above allows the controller to easily and accurately identify a portion of DC-DC converter 14 with failure.

Moreover, as described earlier, in-vehicle power supply system 11 starts to determine a failure from input switch 16, which is on the high voltage side, and proceeds the determination successively to the low voltage side. This means that, when a switch in conversion circuit 17 has failure due to short-circuit, subsequent determination is not performed after that. Therefore, no voltage is applied to conversion circuit 17 or output switch 18 in the failure determination proceeding from the high voltage side to the low voltage side. In other words, when the determination of the low voltage side is performed, it has already been determined beforehand that conversion circuit 17 and input switch 16 are normal. Thereby, it is possible to set an appropriate voltage for conversion circuit 17 and output switch 18 especially when performing a failure determination operation of output switch 18. This configuration prevents a secondary failure. Furthermore, it is unnecessary to increase the withstand voltage of output switch 18 in consideration of the failure determination.

In in-vehicle power supply system 11 described above, DC-DC converter 14 and controller 15 may be accommodated in, e.g. a single housing, or DC-DC converter 14 and controller 15 may be separately arranged in vehicle body 22.

Particularly in the case that input switch 16 is implemented by a semiconductor switch, input switch 16 may preferably include two semiconductor switches connected in series such that the parasitic diodes are connected in opposite directions.

REFERENCE MARKS IN THE DRAWINGS 11 in-vehicle power supply system
12 high-voltage DC power supply
12A storage battery
13 low voltage storage battery
14 DC-DC converter
15 controller
16 input switch
17 conversion circuit
17A high-voltage terminal
17B low voltage terminal
18 output switch
19 current detector
20 input capacitor
21 vehicle
22 vehicle body
23 power generator
24 high-side switch
24A high-side diode
25 choke coil
26 low-side switch
27 smoothing capacitor
28 resistor
29 converter diode

The invention claimed is:

1. An in-vehicle power supply system comprising:
a high-voltage direct-current (DC) power supply;
a low-voltage storage battery;
a DC-DC converter including
an input switch including one terminal and another terminal, the one terminal of the input switch being connected to the high-voltage DC power supply, the input switch being configured to selectively switch between a connected state in which the one terminal of the input switch is connected to the another terminal of the input switch and a disconnected state in which the one terminal of the input switch is disconnected from the another terminal of the input switch,
a conversion circuit including a high-voltage terminal and a low-voltage terminal, the high-voltage terminal of the conversion circuit being connected to the another terminal of the input switch, the conversion circuit being configured to perform a bidirectional operation of performing a boosting-up operation of obtaining a voltage of the high-voltage terminal by boosting up a voltage of the low-voltage terminal and a stepping-down operation of obtaining a voltage of the low-voltage terminal by stepping down a voltage of the high-voltage terminal, and an output switch including one terminal and another terminal, the one terminal of the output switch being connected to the low-voltage terminal of the conversion circuit, the another terminal of the output switch being connected to the low-voltage storage battery, the output switch being configured to selectively switch between a connected state in which the one terminal of the output switch is connected to the another terminal of the output switch and a disconnected state in which the one terminal of the output switch is disconnected from the another terminal of the output switch; and a controller configured to control the DC-DC converter, wherein the controller is configured to, after detecting that a current flowing through the conversion circuit exceeds a predetermined current threshold or that a charge voltage of the low-voltage storage battery exceeds a predetermined voltage threshold, execute a failure determination of the DC-DC converter after instructing the conversion circuit to stop a voltage conversion operation, causing the input switch to switch to the disconnected state, and instructing the output switch to switch to the disconnected state, the controller is configured to, in the failure determination:

execute a first determination operation including (1) an output short-circuit failure determination of detecting a first low voltage value of the low-voltage terminal and determining, based on the first low voltage value, whether or not the output switch has failure due to short-circuit, (2) an output open-circuit failure determination of detecting a second low voltage value of the low-voltage terminal while controlling the output switch to cause the output switch to be in the connected state, and determining, based on the second low voltage value, whether or not the output switch has failure, and (3) an input short-circuit failure determination of detecting a first high voltage value of the high-voltage terminal and determining, based on the first high voltage value, whether or not the input switch has failure due to short-circuit;

if determining, in the first determination operation, that the output switch does not have failure, execute a second determination operation of detecting a second high voltage value of the high-voltage terminal while instructing the output switch to be in the connected state and instructing the conversion circuit to perform the boosting-up operation, and determining, based on the second high voltage value, whether or not the conversion circuit has failure; and if determining, in the second determination operation, that the conversion circuit does not have failure, execute a third determination operation including an input open-circuit failure determination of detecting a third high voltage value of the high-voltage terminal while instructing the conversion circuit not to perform the boosting-up operation and while instructing the input switch to be in the connected state, and determining, based on the third high voltage value, whether or not the input switch has failure.

2. The in-vehicle power supply system of claim 1, wherein the conversion circuit further includes:
 a high-side switch including one terminal and another terminal, the one terminal of the high-side switch being connected to the another terminal of the input switch;
 a choke coil having one terminal and another terminal, the one terminal of the choke coil being connected to the another terminal of the output switch, the another terminal of the choke coil being connected to the another terminal of the high-side switch at a node; and
 a low-side switch including one terminal connected to the node and another terminal connected to a ground, and the controller is configured to, after executing the first determination operation:
 execute a preliminary determination operation of determining, based on a voltage value of the low-voltage terminal of the conversion circuit while controlling the low-side switch to cause the low-side switch to be disconnected, whether or not the low-side switch has failure due to short-circuit; and
 execute the second determination operation if determining that the low-side switch does not have failure in the preliminary determination operation.

3. The in-vehicle power supply system of claim 2, wherein the controller is configured not to execute the second determination operation if determining that the low-side switch has failure in the preliminary determination operation.

4. The in-vehicle power supply system of claim 1, further comprising:
 a converter diode having a cathode connected to the other terminal of the output switch and an anode connected to ground; and
 an input capacitor having one terminal and another terminal, the one terminal of the input capacitor being connected to the another terminal of the input switch, the another terminal of the input capacitor being connected to ground, wherein the conversion circuit further includes:
 a high-side switch including one terminal and another terminal, the one terminal of the high-side switch being connected to the another terminal of the input switch;
 a choke coil having one terminal and another terminal, the one terminal of the choke coil being connected to the another terminal of the output switch, the another terminal of the choke coil being connected to the another terminal of the high-side switch at a node;
 a low-side switch including one terminal connected to the node and another terminal connected to the ground; and
 a high-side diode having a cathode connected to the input switch and an anode connected to the node, the controller is configured to, in the second determination operation:
 if determining that the output switch does not have failure in the first determination operation, charge the input capacitor such that a voltage of the input capacitor becomes a predetermined value by causing the choke coil, the converter diode, and the output switch to operate as a step-down converter by periodically switching the output switch; and then, detect a fourth high voltage value of the high-voltage terminal while controlling the conversion circuit to boost the voltage of the low-voltage terminal while instructing the output switch to be in the connected state, and determine, based on the fourth high voltage value, whether or not the conversion circuit has failure.

5. The in-vehicle power supply system of claim 1, wherein the controller is configured to perform the output short-circuit failure determination and the input short-circuit failure determination, and then perform the output open-circuit failure determination in the first determination operation.

6. The in-vehicle power supply system of claim 5, wherein the controller is configured to perform the input short-circuit failure determination, and then perform the output open-circuit failure determination in the first determination operation.

* * * * *